(12) United States Patent
Mizukami et al.

(10) Patent No.: US 8,585,862 B2
(45) Date of Patent: Nov. 19, 2013

(54) PLASMA PROCESSING DEVICE AND PLASMA DISCHARGE STATE MONITORING DEVICE

(75) Inventors: Tatsuhiro Mizukami, Fukuoka (JP); Kiyoshi Arita, Fukuoka (JP); Masaru Nonomura, Fukuoka (JP)

(73) Assignee: Panasonic Corporation, Osaka (JP)

(*) Notice: Subject to any disclaimer, the term of this patent is extended or adjusted under 35 U.S.C. 154(b) by 755 days.

(21) Appl. No.: 12/598,815

(22) PCT Filed: Aug. 21, 2008

(86) PCT No.: PCT/JP2008/065351
§ 371 (c)(1),
(2), (4) Date: Nov. 4, 2009

(87) PCT Pub. No.: WO2009/025393
PCT Pub. Date: Feb. 26, 2009

(65) Prior Publication Data
US 2010/0132890 A1    Jun. 3, 2010

(30) Foreign Application Priority Data

Aug. 21, 2007  (JP) ............................. P2007-214322
Aug. 21, 2007  (JP) ............................. P2007-214324

(51) Int. Cl.
*H01L 21/3065*  (2006.01)
*C23C 16/52*    (2006.01)
*C23C 16/505*   (2006.01)
*C23C 16/50*    (2006.01)

(52) U.S. Cl.
USPC ............. 156/345.28; 156/345.24; 118/723 E; 118/712; 118/713; 315/111.21

(58) Field of Classification Search
USPC ....... 156/345.28, 345.24, 345.25; 118/723 E, 118/712, 713; 315/111.01, 111.21
See application file for complete search history.

(56) References Cited

U.S. PATENT DOCUMENTS 5,522,957 A    6/1996  Weling et al.
5,658,418 A *  8/1997  Coronel et al. .......... 156/345.25
(Continued)

FOREIGN PATENT DOCUMENTS

EP    1 531 490 A1   5/2005
JP    64-081197 A    3/1989
(Continued)

OTHER PUBLICATIONS

International Search Report for PCT/JP2008/065351.

*Primary Examiner* — Jeffrie R Lund
(74) *Attorney, Agent, or Firm* — Pearne & Gordon LLP

(57) ABSTRACT

An object is to provide a plasma processing device capable of highly accurately monitoring an operation state including whether or not the plasma discharge is executed, whether the discharge is normal or abnormal and whether or not the maintenance work of the vacuum chamber is necessary.

A discharge detection sensor 23, in which a dielectric member 21 and a probe electrode unit 22 are combined with each other, is attached to an opening portion 2a provided in a lid portion 2 composing a vacuum chamber. A change in electric potential induced according to a change in plasma discharge in a probe electrode is received by a plurality of wave-form detecting portions and a detection signal is outputted each time a change in electric potential agreeing with a predetermined different condition appears. The detection signal outputted from the corresponding wave-form detecting portion is counted by the plurality of wave-form detecting portions and the counted value is held. According to the counted value, an operation state is highly accurately monitored which includes whether or not the plasma discharge is executed, whether the discharge is normal or abnormal and whether or not the maintenance work of the vacuum chamber is necessary.

9 Claims, 9 Drawing Sheets

(56) References Cited

U.S. PATENT DOCUMENTS

| | | | |
|---|---|---|---|
| 5,810,963 A * | 9/1998 | Tomioka | 156/345.28 |
| 5,993,615 A | 11/1999 | Abry et al. | |
| 6,332,961 B1 * | 12/2001 | Johnson et al. | 204/192.13 |
| 6,716,301 B2 * | 4/2004 | Kanno et al. | 156/345.28 |
| 7,767,053 B2 * | 8/2010 | Takeda et al. | 156/345.28 |
| 7,931,776 B2 * | 4/2011 | Itabashi et al. | 156/345.24 |
| 8,237,367 B2 * | 8/2012 | Nonomura et al. | 315/111.21 |
| 8,282,767 B2 * | 10/2012 | Itabashi et al. | 156/345.28 |
| 8,450,933 B2 * | 5/2013 | Nonomura et al. | 315/111.21 |
| 2005/0011611 A1 * | 1/2005 | Mahoney et al. | 156/345.24 |
| 2005/0159835 A1 * | 7/2005 | Yamada et al. | 700/109 |
| 2005/0167396 A1 | 8/2005 | Calderoni et al. | |
| 2005/0194094 A1 * | 9/2005 | Yasaka | 156/345.28 |
| 2005/0212450 A1 | 9/2005 | Martinez et al. | |
| 2006/0252283 A1 * | 11/2006 | Takeda et al. | 438/798 |
| 2007/0042131 A1 * | 2/2007 | Soo et al. | 427/569 |
| 2007/0058322 A1 | 3/2007 | Ito et al. | |
| 2008/0075640 A1 * | 3/2008 | Takeda et al. | 422/186.29 |
| 2010/0132890 A1 * | 6/2010 | Mizukami et al. | 156/345.28 |
| 2010/0163182 A1 * | 7/2010 | Mizukami et al. | 156/345.26 |
| 2010/0176085 A1 * | 7/2010 | Mizukami et al. | 216/61 |
| 2010/0243470 A1 * | 9/2010 | Nonomura et al. | 205/641 |
| 2010/0282711 A1 * | 11/2010 | Chung et al. | 216/61 |
| 2011/0109530 A1 * | 5/2011 | Nonomura | 345/60 |
| 2011/0272098 A1 * | 11/2011 | Nonomura | 156/345.26 |
| 2011/0273094 A1 * | 11/2011 | Nonomura et al. | 315/111.21 |
| 2011/0277933 A1 * | 11/2011 | Nonomura et al. | 156/345.28 |
| 2012/0109582 A1 * | 5/2012 | Moriya et al. | 702/183 |

FOREIGN PATENT DOCUMENTS

| | | |
|---|---|---|
| JP | 02-026023 A | 1/1990 |
| JP | 2003-318115 A | 11/2003 |
| JP | 2005-268214 A | 9/2005 |
| JP | 2007-073309 A | 3/2007 |
| JP | 2007-115860 A | 5/2007 |
| JP | 2007-149596 A | 6/2007 |

* cited by examiner

PLASMA PROCESSING DEVICE AND PLASMA DISCHARGE STATE MONITORING DEVICE

TECHNICAL FIELD

The present invention relates to a plasma processing device for executing plasma processing for an object to be processed such as a board. The present invention also relates to a plasma discharge state judging device for monitoring a plasma discharge state.

BACKGROUND ART

Plasma processing is well known as a surface processing method for executing cleaning or etching upon an object to be processed such as a board on which electronic parts are mounted. In plasma processing, a board to be processed is put into a vacuum chamber forming a processing chamber. Then, plasma discharge is generated in the processing chamber. When ions and electrons generated as a result of the plasma discharge are made to act on a surface of the board, predetermined surface processing is executed. In order to stably execute the plasma processing at high quality, it is necessary that plasma discharge is properly generated according to a condition of plasma discharge which has been previously determined conforming to an object of processing. Therefore, for the object of monitoring a state of the generation of plasma discharge, various means and methods have been conventionally employed.

For example, a method is known which detects an influence exerted upon voltage or current of a high frequency power supply portion by a change in plasma discharge for some factors. Further, a method is known which estimates a state of discharge when a self-bias voltage generated between electrodes by plasma discharge is detected. However, these methods are disadvantageous as follows. In the case where it is necessary to generate plasma discharge under the condition of low output, the detection accuracy is low and it is difficult to accurately detect a state of plasma discharge. Due to the above disadvantages of the conventional methods, a method by which a change in the plasma discharge state can be directly detected has been recently used. Concerning this matter, for example, refer to Patent Document 1. This method detects the existence of abnormal discharge as follows. A discharge detection sensor having a probe electrode for detecting electric potential is attached into a vacuum chamber in which a processing chamber is provided. When a change in the electric potential, which is induced according to a change in plasma discharge in the probe electrode is detected, whether or not abnormal discharge is caused in the processing chamber is detected.

Patent Document 1: Official gazette of JP-A-2003-318115

According to this method, it is possible to highly sensitively detect a change in the state of plasma discharge generated in the processing chamber. Therefore, even when an output of the high frequency power supply portion is low, it is possible in principle to properly monitor whether or not plasma discharge is executed and it is also possible to properly monitor whether or not the plasma discharge is abnormal. However, the above Patent Document does not clearly disclose a specific application example necessary for highly accurately monitor a state of operation including whether or not the plasma discharge is executed, whether the plasma discharge is normal or abnormal and whether or not it is necessary to execute the maintenance work for the vacuum chamber. Therefore, it has been desired to develop a new application technique to be applied to an actual plasma discharge device.

DISCLOSURE OF THE INVENTION

An object of the present invention is to provide a plasma processing device capable of highly accurately monitoring a state of operation including whether or not the plasma discharge is executed, whether the plasma discharge is normal or abnormal and whether or not it is necessary to execute the maintenance work for the vacuum chamber.

Another object of the present invention is to provide a plasma discharge state monitoring device capable of rightly monitoring whether or not the plasma discharge is executed and whether the plasma discharge is normal or abnormal.

The present invention provides a plasma processing device for executing plasma processing for an object to be processed which is accommodated in a processing chamber, comprising: a vacuum chamber forming the processing chamber; an electrode portion arranged in the processing chamber; a vacuum exhaust portion for exhausting gas from the processing chamber by vacuum; a gas supply portion for supplying gas, which is used for generating plasma, into the processing chamber; a high frequency power supply portion for generating plasma discharge in the processing chamber when a high frequency voltage is impressed upon the electrode portion; a matching device for matching impedance of a plasma discharge circuit for generating plasma discharge with impedance of the high frequency power supply portion; and a plasma discharge state monitoring unit for monitoring a plasma discharge state in the processing chamber, the plasma discharge state monitoring unit including: a discharge detection sensor having a plate-shaped dielectric member attached to the vacuum chamber so that one face of the plate-shaped dielectric member can be opposed to the plasma discharge generated in the processing chamber and also having a probe electrode arranged on the other face of the plate-shaped dielectric member; a plurality of wave-form detecting portions which receives a change in electric potential induced according to a change in the plasma discharge in the probe electrode and outputs a detection signal each time a change in electric potential agreeing with a predetermined condition appears; a plurality of counters which respectively correspond to the plurality of wave-form detecting portions and count the detection signal outputted from the corresponding wave-form detecting portion and hold the counted value; and a judging portion for judging an operation state according to the counted value, wherein the predetermined conditions in the respective wave-form detecting portions are different from each other.

The plasma discharge state monitoring device of the present invention is a plasma discharge state monitoring device used for a plasma processing device for executing plasma processing for an object to be processed which is accommodated in a processing chamber so as to monitor a plasma discharge state in the processing chamber, comprising: a discharge detection sensor having a plate-shaped dielectric member attached to a vacuum chamber forming the processing chamber so that one face of the plate-shaped dielectric member can be opposed to the plasma discharge generated in the processing chamber and also having a probe electrode arranged on the other face of the plate-shaped dielectric member; and a wave-form detecting portion for receiving a change in electric potential induced according to a change in the plasma discharge in the probe electrode and for detecting a predetermined wave-form, the wave-form detecting portion including: an N-type wave-form detecting portion for detecting an N-type electric potential change wave-form which is formed into an N-shaped wave-form pattern returning to a steady value after an electric potential has deflected to both the positive and the negative side; and a V-type wave-form detecting portion for detecting a V-shaped electric potential change wave-form which is formed into a V-shaped wave-form pattern returning to a steady value after the electric potential has deflected only to the negative side.

According to the present invention, the plasma discharge state monitoring unit for monitoring a plasma discharge state in the processing chamber includes: a discharge detection sensor having at least a plate-shaped dielectric member attached in the vacuum chamber and also having a probe electrode arranged on the other side of this dielectric member; a plurality of wave-form detecting portions which receives a change in electric potential induced according to a change in plasma discharge in the probe electrode and outputs a detection signal each time a change in electric potential agreeing with a predetermined different condition appears; and a plurality of counters which counts a detection signal outputted from the corresponding wave-form detecting portion and holds the counted value, wherein when an operation state is judged according to the counted value, it is possible to highly accurately monitor an operation state including whether or not the plasma discharge is executed, whether the plasma discharge is normal or abnormal and whether or not the maintenance work in the vacuum chamber is necessary.

BEST MODE FOR CARRYING OUT THE INVENTION

Embodiment 1

Figure 1:
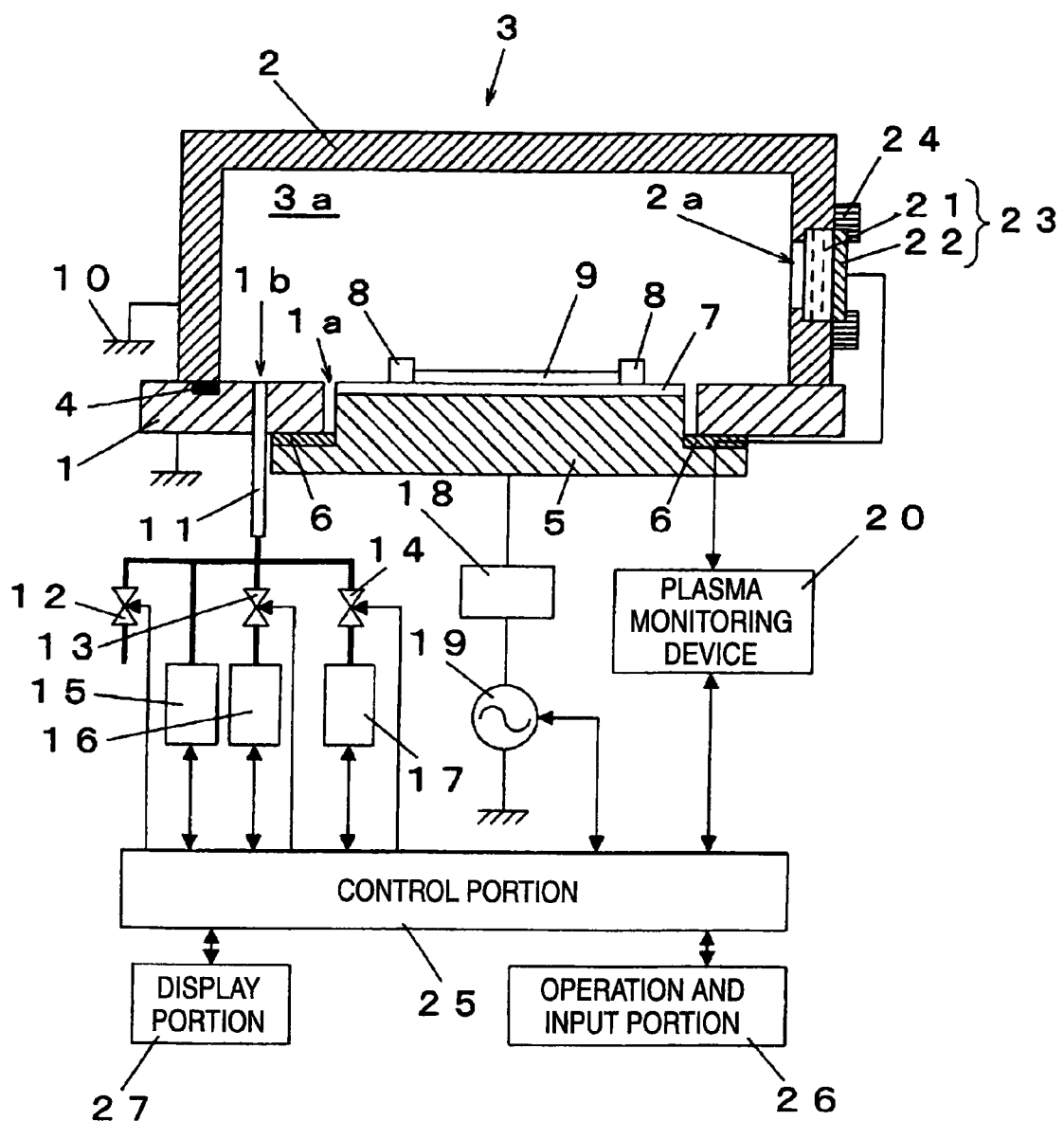
FIG. 1 is a sectional view showing a plasma processing device of Embodiment 1 of the present invention.
Figure 2:
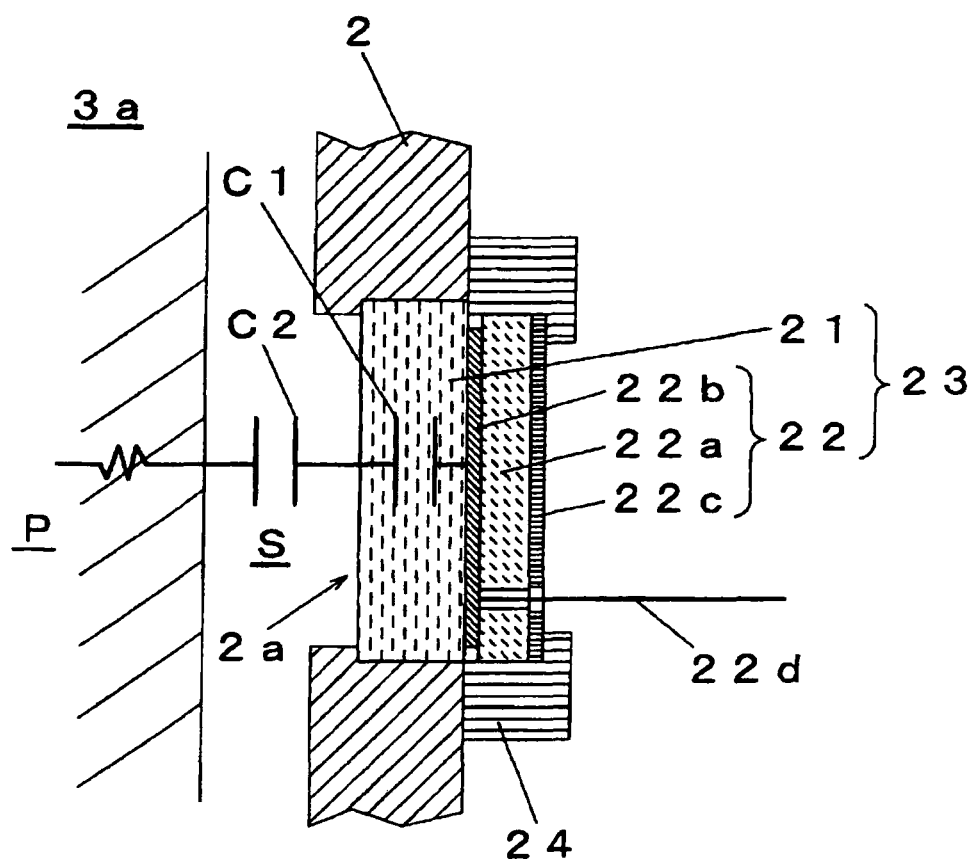
FIG. 2 is a schematic illustration for explaining an arrangement of the discharge detection sensor used for the plasma processing device of Embodiment 1 of the present invention.
Figure 3:
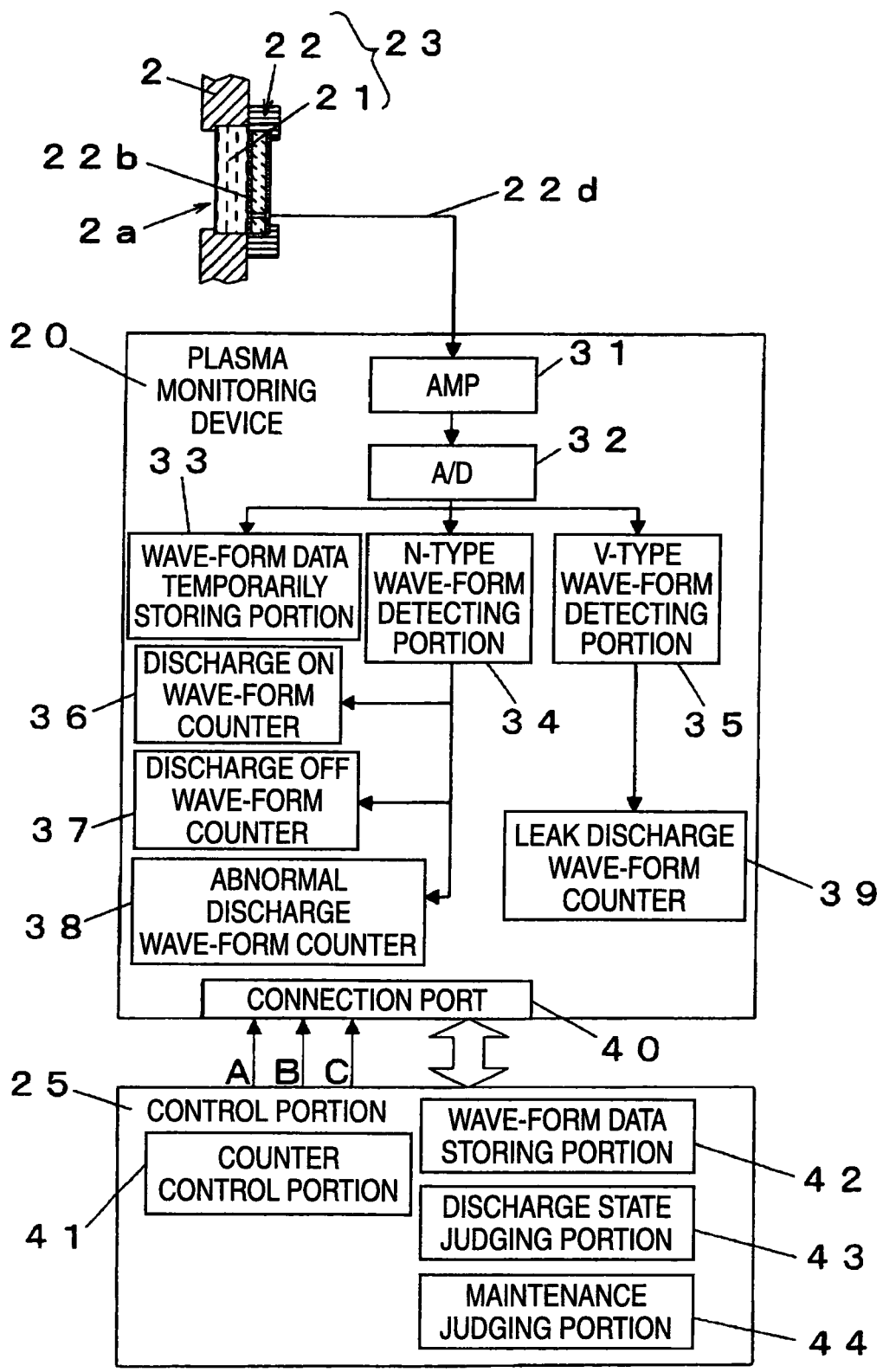
FIG. 3 is a block diagram showing an arrangement of the plasma discharge state monitoring device of the plasma processing device of Embodiment 1 of the present invention.
Figure 4:
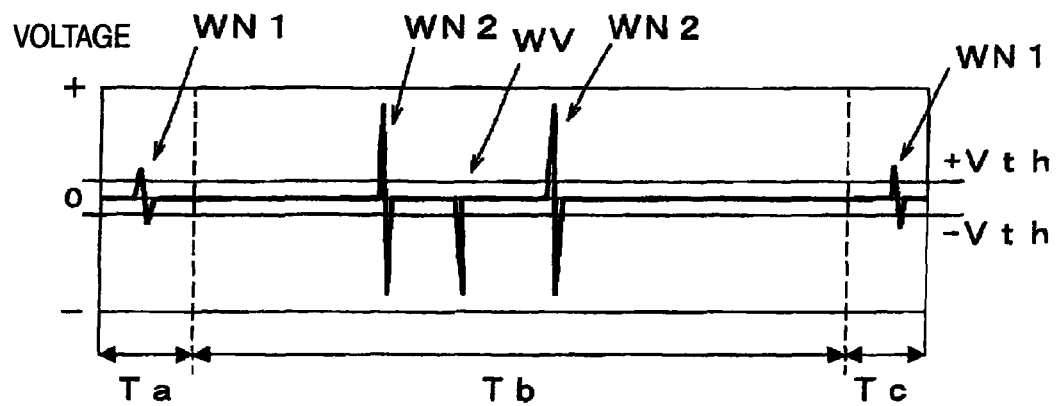
FIGS. 4(a) and 4(b) are schematic illustrations for explaining an electric potential change wave-form and a wave-form monitoring time zone in the plasma discharge state monitoring method of Embodiment 1 of the present invention.
Figure 4:
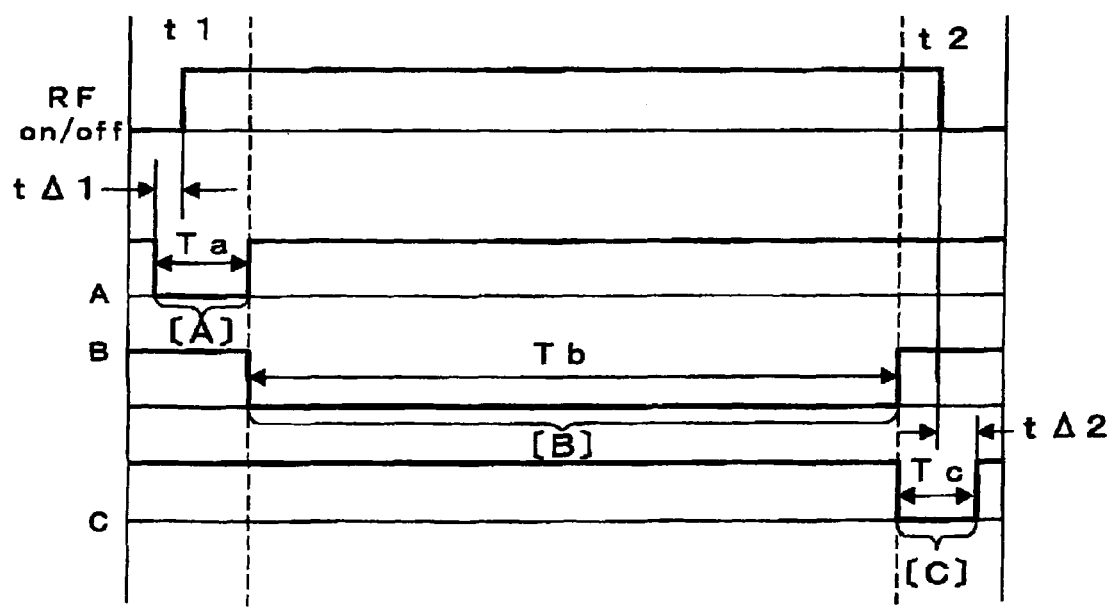
Figure 5:
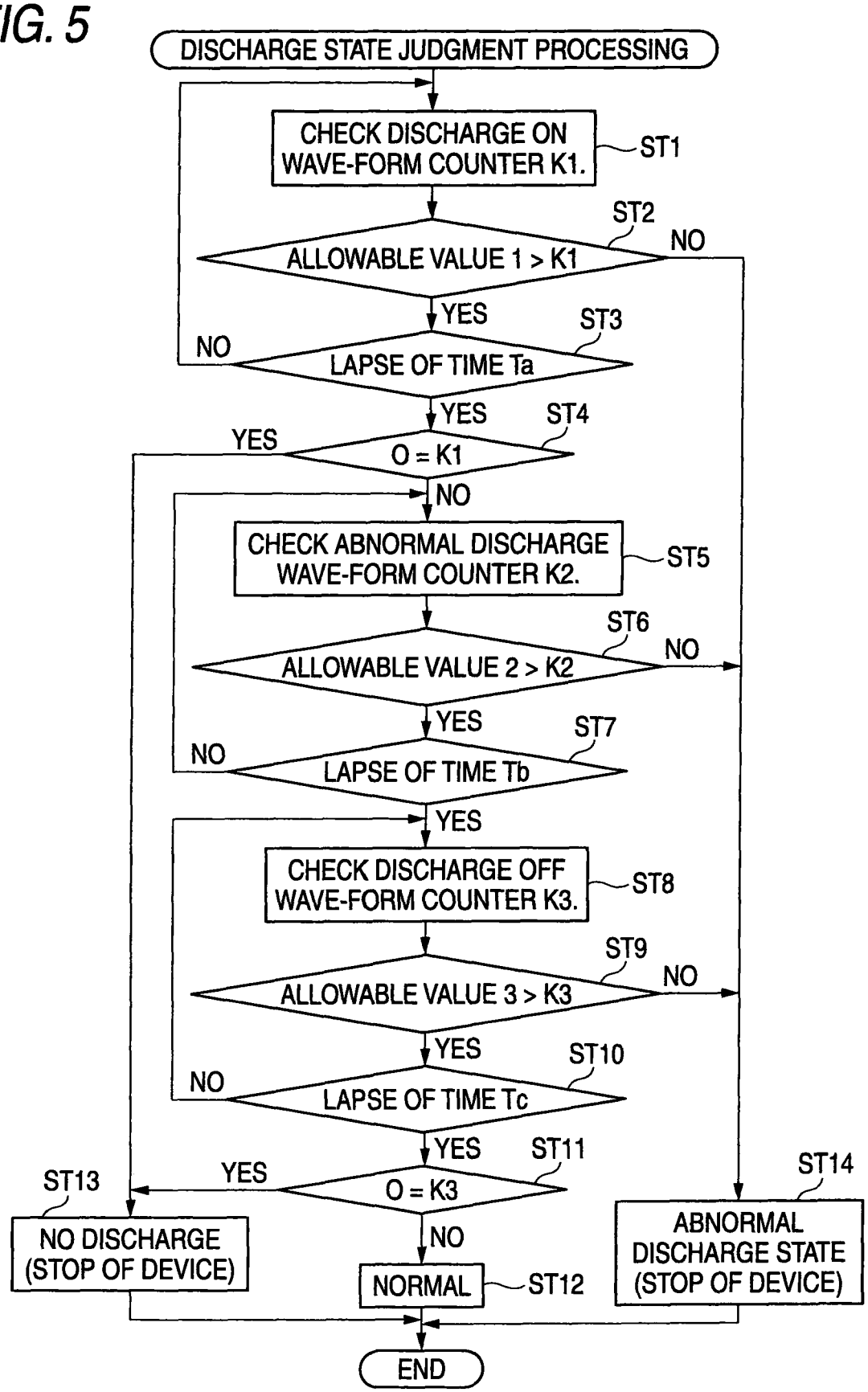
FIG. 5 is a flow chart of the discharge state judgment processing executed in the plasma discharge state monitoring method of Embodiment 1 of the present invention.
Figure 6:
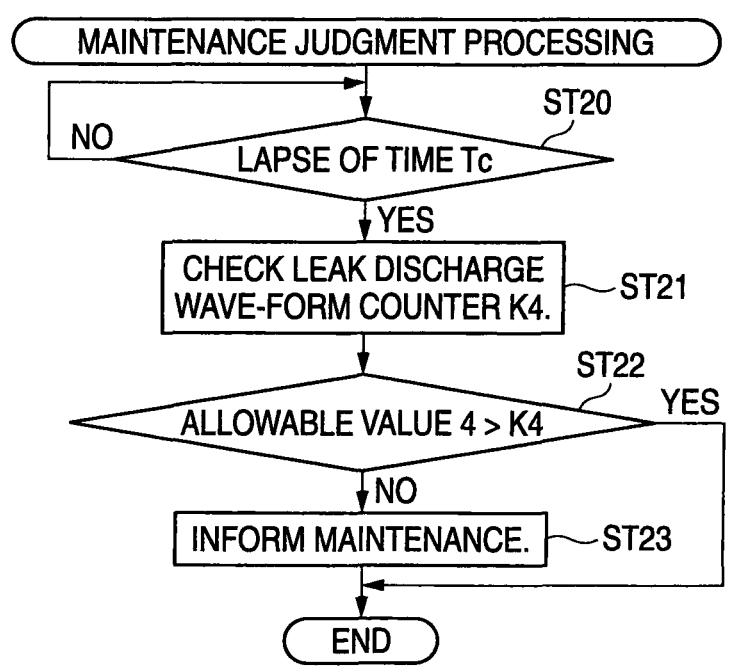
FIG. 6 is a flow chart of the maintenance judgment processing executed in the plasma discharge state monitoring method of Embodiment 1 of the present invention.

FIG. 1 is a sectional view showing a plasma processing device of Embodiment 1 of the present invention. FIG. 2 is a schematic illustration for explaining an arrangement of the discharge detection sensor used for the plasma processing device of Embodiment 1 of the present invention. FIG. 3 is a block diagram showing an arrangement of the plasma discharge state monitoring device of the plasma processing device of Embodiment 1 of the present invention. FIGS. 4(a) and 4(b) are schematic illustrations for explaining an electric potential change wave-form and a wave-form monitoring time zone in the plasma discharge state monitoring method of Embodiment 1 of the present invention. FIG. 5 is a flow chart of the discharge state judgment processing executed in the plasma discharge state monitoring method of Embodiment 1 of the present invention. FIG. 6 is a flow chart of the maintenance judgment processing executed in the plasma discharge state monitoring method of Embodiment 1 of the present invention.

First, referring to FIG. 1, a structure of the plasma processing device will be explained below. In FIG. 1, the vacuum chamber 3 is composed in such a manner that the lid portion 2 is arranged on the horizontal base portion 1 being freely elevated by an elevating unit (not shown). In a state in which the lid portion 2 is lowered and contacted with an upper face of the base portion 1 through the sealing member 4, the vacuum chamber 3 is put into a closed state. An air-tightly closed space surrounded by the base portion 1 and the lid portion 2 forms a processing chamber 3a in which an object to be processed is accommodated and subjected to plasma processing. In the processing chamber 3a, the electrode portion 5 is arranged. The electrode portion 5 is attached to the opening portion 1a, which is provided in the base portion 1, from the lower side through the insulating member 6. Onto an upper face of the electrode portion 5, the insulating body 7 is attached. The board 9, which is an object to be processed, is conveyed onto an upper face of the insulating body 7 in the board conveyance direction (the direction perpendicular to the surface of the drawing) while both side end portions are being guided by the guide member 8.

The open hole 1b provided in the base portion 1 is connected to the vent valve 12, the vacuum meter 15, the gas supply valve 13 and the vacuum valve 14 through the pipe line 11. Further, the gas supply valve 13 and the vacuum valve 14 are respectively connected to the gas supply portion 16 and the vacuum pump 17. When the vacuum valve 14 is opened while the vacuum pump 17 is being driven, the inside of the processing chamber 3a is exhausted by vacuum. At this time, the degree of vacuum is detected by the vacuum meter 15. The vacuum valve 14 and the vacuum pump 17 compose a vacuum exhaust portion by which the inside of the processing chamber 3a is exhausted by vacuum. When the gas supply valve 13 is opened, gas used for generating plasma is supplied from the gas supply portion 16 into the processing chamber 3a used for generating plasma. The gas supply portion 16 has a flow rate adjusting function. Therefore, it is possible to supply an arbitrary quantity of gas used for generating plasma into the processing chamber 3a. When the vent valve 12 is opened, the atmosphere is introduced into the processing chamber 3a at the time of breakage of vacuum.

The electrode portion 5 is electrically connected to the high frequency power supply portion 19 through the matching device 18. When the high frequency power supply portion 19 is driven under the condition that gas is supplied into the processing chamber 3a after the completion of exhaustion by vacuum, a high frequency voltage is impressed between the electrode portion 5 and the lid portion 2 which is grounded to the ground portion 10. Due to this impression of high frequency voltage, plasma discharge is generated in the processing chamber 3a. The matching device 18 has a function of matching impedance of the plasma discharge circuit, which generates plasma discharge in the processing chamber 3a, and impedance of the high frequency power supply portion 19 with each other.

On the side of the lid portion 2, the circular opening portion 2a is provided which functions as a peel-hole through which an operator can watch the inside of the processing chamber 3a from the outside of the vacuum chamber 3. In the opening portion 2a, the discharge detection sensor 23, which includes a dielectric member 21 and a probe electrode unit 22, is fixed by the support member 24 from the outside of the lid portion 2. Referring to FIG. 2, an arrangement of the discharge detection sensor 23 will be explained below. The dielectric member 21 made of optically transparent glass is attached to the opening portion 2a provided on the lid portion 2. In the processing chamber 3a, plasma discharge is generated between the electrode portion 5 and the lid portion 2. The dielectric member 21 is attached to the opening portion 2a provided in the vacuum chamber 3 in a posture in which one of the faces of the dielectric member 21 is opposed to the plasma discharge generated in the processing chamber 3a.

On the other face of the dielectric member 21, that is, on the face outside the vacuum chamber 3, the probe electrode unit 22 is attached. The probe electrode unit 22 is an integrated component in which the probe electrode 22b is formed on one of the faces of the glass plate 22a and the shielding electrode 22c is formed on the other face. When the probe electrode unit 22 is attached to the dielectric member 21 and the discharge detection sensor 23 is formed, under the condition that the probe electrode 22b is closely contacted with an outer face (the other face) of the dielectric member 21, it is supported at the lid portion 2 by the support member 24 made of conductive metal. That is, the discharge detection sensor 23 at least includes: a plate-shaped dielectric member 21 attached to the vacuum chamber 3 so that one face can be opposed to the plasma discharge generated in the processing chamber 3a; and a probe electrode 22b arranged on the other face of the dielectric member 21. The probe electrode 22b is connected to the plasma monitoring device 20 through the detection lead wire 22d.

When plasma discharge is generated in the processing chamber 3a, the probe electrode 22b is electrically connected to plasma P through the dielectric member 21 and the sheath S which is a space electric charge layer formed on an interface of the plasma P generated in the processing chamber 3a and the dielectric member 21. That is, as shown in FIG. 2, an electric circuit is formed in which condenser C1 formed out of the dielectric member 21, condenser C2 of the capacity corresponding to sheath S and resistor R of plasma P are connected in series to each other. In the probe electrode 22b, an electric potential corresponding to the state of plasma P is induced. In the present embodiment, the electric potential of the probe electrode 22b is introduced to the plasma monitoring device 20 by the detection lead wire 22d and a change in the electric potential corresponding to the state of plasma P is monitored by the plasma monitoring device 20. In this way, the plasma discharge state in the processing chamber 3a is monitored.

In the processing chamber 3a, when an abnormal discharge is generated in the periphery of the board 9 mounted on the electrode portion 5, a state of plasma P generated in the processing chamber 3a fluctuates. This fluctuation of plasma P changes the impedance of the electric circuit described above. Therefore, this fluctuation is detected as a change in the electric potential of the probe electrode 22b. This change in the electric potential is highly sensitively detected. Therefore, this detection of detecting the change in the electric potential is characterized in that even a minute fluctuation, which can be seldom detected by the conventional method, can be detected. The shielding electrode 22c has a function of electrically shielding the outside of the probe electrode 22b. Therefore, an electric charge generated in the shielding electrode 22c is released to the lid portion 2 through the conductive support member 24. Due to the foregoing, noise with respect to the change in the electric potential induced in the probe electrode 22b can be reduced.

In the present embodiment, both the probe electrode 22b and the shielding electrode 22c are formed in such a manner that a transparent conductive material such as ITO is coated on a surface of the glass plate 22a being formed like a film. Due to this structure, when the discharge detection sensor 23 is attached to the opening portion 2a, an operator can watch the inside of the processing chamber 3a from the outside of the lid portion 2 through the opening portion 2a. In the discharge detection sensor 23 shown in the present embodiment, the dielectric member 21 is formed out of an optically transparent glass attached to the opening portion 2a (the peep-hole) used for watching the inside of the processing chamber 3a from the outside of the vacuum chamber 3 and the probe electrode 22b is made of an optically transparent conductive material.

Due to the above structure, both the peep-hole for watching the inside of the processing chamber 3a and the probe electrode 22b for monitoring a plasma discharge state can be used at the same time. Since the dielectric member 21 is exposed to plasma P generated in the processing chamber 3a, a surface of the dielectric member 21 is damaged. Therefore, it is necessary to replace the dielectric member 21 at a predetermined interval. Even in this case, the probe electrode unit 22 and the dielectric member 21 are composed separately from each other, it is sufficient that only the dielectric member 21, which is one of the consumable parts, is replaced and it is unnecessary to replace the probe electrode unit 22.

The plasma processing device includes a control portion 25 for controlling the overall operation. When the control portion 25 controls a vent valve 12, gas supply valve 13, vacuum valve 14, vacuum meter 15, gas supply portion 16, vacuum pump 17 and high frequency power supply portion 19, each operation necessary for the plasma processing can be carried out. The control portion 25 controls the plasma monitoring device 20 and at the same time, the control portion 25 has a function of receiving a result of the detection obtained by the plasma monitoring device 20 and executing necessary control processing. The control portion 25 includes an operation and input portion 26 and a display portion 27. The operation and input portion 26 inputs various operation and data upon execution of the plasma processing operation. The display portion 27 displays an operation image plane at the time of the inputting operation executed by the operation and input portion 26. Further, the display portion 27 displays a result of the judgment made by the control portion 25 according to the result of the detection of the plasma monitoring device 20.

Next, referring to FIG. 3, explanations will be made into the constitution and the function of the plasma monitoring device 20 and the control portion 25. In FIG. 3, the plasma monitoring device 20 includes: an AMP (amplifier) 31, an ND converter 32, a wave-form data temporarily storing portion 33, an N-type wave-form detecting portion 34, a V-type wave-form detecting portion 35, a discharge ON wave-form counter 36, a discharge OFF wave-form counter 37, an abnormal discharge wave-form counter 38 and a leak discharge wave-form counter 39. The AMP 31 amplifies a change in the electric potential of the probe electrode 22b transmitted through the detection lead wire 22d. The A/D converter 32

A/D-converts a signal of the change in the electric potential, which is amplified by AMP 31, into an ND signal. A voltage displacement signal, which has been ND-converted by ND converter 32, that is, a digital signal showing a change in voltage is sent to the wave-form data temporarily storing portion 33, the N-type wave-form detecting portion 34 and the V-type wave-form detecting portion 35.

The wave-form data temporarily storing portion 33 temporarily stores a digital signal showing a change of the electric potential, which has been received, as wave-form data. The N-type wave-form detecting portion 34 recognizes the received digital signal as a wave-form and the thus recognized wave-form is compared with a predetermined condition, which has been previously set. The N-type wave-form detecting portion 34 detects an N-shaped wave-form having an N-shaped wave-form pattern. When the N-shaped wave-form is detected, a detection signal is outputted each time of the detection. The V-type wave-form detecting portion 35 recognizes the received digital signal as a wave-form in the same manner and the thus recognized wave-form is compared with a predetermined condition, which has been previously set, and detects a V-shaped wave-form having a V-shaped wave-form pattern. When the V-shaped wave-form is detected, a detection signal is outputted each time of the detection. That is, the N-type wave-form detecting portion 34 and the V-type detecting portion 35 are a plurality of wave-form detecting portions for receiving a change in the electric potential, which is induced according to a change in the plasma discharge in the probe electrode 22b, and for detecting a predetermined wave-form. Both of them have a function of outputting a detection signal each time of the appearance of a change in the electric potential agreeing with a predetermined condition. In the N-type wave-form detecting portion 34 and the V-type wave-form detecting portion 35, a predetermined condition, which is set for detecting a wave-form, is different according to the wave-form pattern to be detected as explained below.

Referring to FIGS. 4(a) and 4(b), explanations will be made into a wave-form pattern of the wave-form detected when a change in the electric potential is received by the discharge detection sensor 23 at the time of operation of the plasma processing device. Explanations will be also made into a type of the abnormal discharge generated in the processing chamber 3a according to the operation of the plasma processing device. FIG. 4(a) is a view showing a wave-form pattern detected in the process from the start of operation of the plasma processing device to the end of operation and also showing a predetermined time which has been previously set for detecting the wave-form pattern. In this case, the predetermined time is the first predetermined time Ta, the second predetermined time Tb and the third predetermined time Tc.

The time chart shown in FIG. 4(b) shows the setting timing of a plurality of wave-form monitoring time zones to which a predetermined time is allotted, wherein the setting timing is shown being related to the timing of start and end of the high frequency power supply impression executed by the high frequency power supply portion 19. In this case, the wave-form monitoring time zone is set so that a time zone for monitoring and counting a detected wave-form can be specified for each type of wave-form. In the present embodiment, three time zones including the first wave-form monitoring time zone [A], the intermediate wave-form monitoring time zone [B] and the last wave-form monitoring time zone [C], which will be explained later, are set being related to the predetermined time described above.

First of all, the first predetermined time Ta and the third predetermined time Tc which are shown in FIG. 4(a) are a predetermined time, which is allotted to the first wave-form monitoring time zone [A] for detecting a wave-form appearing at the time of the start of impression of the high frequency power supply, and the predetermined time, which is allotted to the last wave-form monitoring time zone [C] for detecting a wave-form appearing at the time of the end of impression of the high frequency power supply. The first wave-form monitoring time zone [A] is a time zone in which the first predetermined time Ta, which is set at a period of time capable of positively detecting a wave-form, containing an impression start timing (Concerning this timing, refer to the timing t1 showing RFon in the time chart of FIG. 4(b).) of the high frequency voltage executed by the high frequency power supply portion 19, that is, while the timing going back from the timing t1 by the surplus time tΔ1 is set at the starting point. The last wave-form monitoring time zone [C] is a time zone in which the third predetermined time Tc, which is set at a period of time capable of positively detecting a wave-form, containing an impression end timing (Concerning this timing, refer to the timing t2 showing RFoff in the time chart of FIG. 4(b).) of the high frequency voltage executed by the high frequency power supply portion 19, that is, while the timing going after from the timing t2 by the surplus time tΔ2 is set at the starting point.

In the first wave-form monitoring time zone [A] and the last wave-form monitoring time zone [C], the N-type electric potential change wave-form pattern (N1-type wave-form WN1) is detected which is a wave-form pattern peculiar to a change in the plasma discharge state caused by the start and the end of the impression of the high frequency power source, that is, which is an N-shaped wave-form pattern in which the electric potential deflects to both the positive and negative side and then returns to a steady value as shown in FIG. 4(a). This wave-form is detected when it is checked that the state agrees with a predetermined condition, that is, when it is checked that a change in the electric potential detected reaches the threshold value level ±Vth which has been previously set on both the positive and the negative side.

The time zone interposed between the first wave-form monitoring zone [A] and the last wave-form monitoring zone [C], that is, the intermediate wave-form monitoring zone [B], which has been set containing the second predetermined time tb, is a time zone corresponding to the continuation of normal operation. In this case, the appearance of an electric potential change wave-form caused by an abnormal phenomenon is monitored which is except for the electric potential change wave-form caused in a normal state change at the start and the end of impression of the high frequency power source. That is, as showing in FIG. 4(a), in the intermediate wave-form monitoring time zone [B], a wave-form appearing according to an abnormal discharge and a leak discharge are objects to be monitored.

The abnormal discharge is a discharge, which is not normal, generated between the board 9, which is put on the electrode portion 5, and the electrode portion 5. The abnormal discharge is generated in the case where a gap is formed between the board 9 and the insulating body 7 under the condition that the board 9, which is deformed being warped badly, is put on the electrode portion 5. In this case, as shown in FIG. 4(a), the electric potential change wave-form showing a change in the electric potential with time of the probe electrode 22b is an N-shaped electric potential change wave-form pattern (N2-type wave-form WN2) in which the electric potential greatly deflects on both the positive and the negative side and then returns to a steady value. In the same manner as that described before, the detection of this wave-form is made by checking that the state agrees with the predetermined condition described before.

The N-type electric potential change wave-form such as an N1-type wave-form WN1 or an N2-type wave-form WN2 is chiefly detected by the N-type wave-form detecting portion 34. That is, the N-type wave-form detecting portion 34 is the first wave-form detecting portion which receives a change in the electric potential induced in the probe electrode 22*b* according to a change in the plasma discharge and detects a change in the electric potential of the specific pattern generated according to the above abnormal discharge. The N-type wave-form detecting portion 34 detects an N-type electric potential change wave-form agreeing with the predetermined condition described above and outputs a detection signal to the discharge ON wave-form counter 36, the discharge OFF wave-form counter 37 and the abnormal discharge weave form counter 38 which will be explained below.

In this connection, the N1-type wave-form WN1, which is detected in the first wave-form monitoring time zone [A] and the last wave-form monitoring time zone [C], and the N2-type wave-form WN 2, which is caused by an abnormal discharge, belong to the N-type electric potential change wave-form pattern in the same manner. However, the causes of generation are different from each other. Therefore, the widths of deflection are greatly different from each other. In the present Embodiment 1, the N-type wave-forms, the widths of deflection of which are different from each other, are detected by the same N-type wave-form detecting portion 34.

Next, the leak discharge will be explained below. The leak discharge is a minute discharge generated between a portion such as an electrode portion 5 or a guide member 8 provided in the processing chamber 3*a* upon which a high frequency voltage is impressed and a portion in the periphery, the electric potential of which is equal to the ground electric potential. The leak discharge described above is generated by the deterioration of the insulating property caused when foreign objects generated by the execution of the plasma processing are attached and deposited in the guide portion 8 for guiding the conveyance of the board 9 and in the opening portion 1*a*. Especially, in a portion such as a side of the guide member 8 or an inner side of the opening portion 1*a* from which the attached foreign objects can be seldom removed by the direct injection of plasma, fine particles of resin and metal removed from a workpiece are easily attached and deposited. As a result, the insulating property is deteriorated in these portions and the leak discharge is generated between these portions and the base member 1 which is grounded.

In this case, the leak discharge does not so much affect a plasma discharge state in the processing chamber 3*a*. Therefore, the electric potential change wave-form showing an electric potential change of the probe electrode 22*b* with time becomes a V-shaped electric potential change wave-form pattern in which the electric potential deflects only to the negative side and then returns to the steady value like the V-shaped wave-form WV shown in FIG. 4(*a*). This V-shaped wave-form is detected by checking that the detected electric potential change has reached the threshold value level ±Vth, which has been previously set on both the positive and the negative side, only on the negative side.

This V-shaped electric potential change wave-form is chiefly detected by the V-shaped wave-form detecting portion 35. That is, this V-shaped wave-form detecting portion 35 is the second wave-form detecting portion which receives an electric potential change induced according to the change in the plasma discharge in the probe electrode 22*b* in the same manner and detects an electric potential change wave-form of the specific pattern caused by the leak discharge described before. The V-shaped wave-form detecting portion 35 detects a change of the above V-shaped electric potential change wave-form agreeing with a predetermined condition and outputs a detection signal to the leak discharge wave-form counter 39.

When the N-shaped wave-form detecting portion 34 and the V-shaped wave-form detecting portion 35 respectively detect a specific pattern which is an object to be detected, the N-shaped wave-form detecting portion 34 and the V-shaped wave-form detecting portion 35 respectively output a detection signal, which expresses that a wave-form of the specific pattern has been detected, to the discharge ON wave-form counter 36, the discharge OFF wave-form counter 37, the abnormal discharge wave-form counter 38 and the leak discharge wave-form counter 39. The discharge ON wave-form counter 36, the discharge OFF wave-form counter 37, the abnormal discharge wave-form counter 38 and the leak discharge wave-form counter 39 are a plurality of counters which cope with a plurality of wave-form detecting portions (the N-shaped wave-form detecting portion 34, the V-shaped wave-form detecting portion 35), count the detection signal outputted from the corresponding wave-form detecting portion and hold the counted value.

First, explanations will be made into the discharge ON wave-form counter 36, the discharge OFF wave-form counter 37 and the abnormal discharge wave-form counter 38 which count the detection signal outputted from the N-shaped wave-form detecting portion 34. The discharge ON wave-form counter 36, the discharge OFF wave-form counter 37 and the abnormal discharge wave-form counter 38 are a plurality of counters (the first counters) which count the detection signal outputted from the N-shaped wave-form detecting portion 34 and hold the counted value. The plurality of counters record the number of times at which the N-shaped wave-form detecting portion 34 detects N-shaped wave forms.

The wave-form monitoring time zone, in which the detection signal outputted from the N-shaped wave-form detecting portion 34 is counted by the plurality of counters (three counters in this case) as described above, and is previously decided for each counter to form the configuration having the three counters corresponding to respective wave-form monitoring zones. As shown in FIG. 4(*b*), these wave-form monitoring time zones are previously set being related to the impression start timing of the high frequency voltage upon the electrode portion 5 in the plasma processing device, that is, being related to the drive on/off timing of the high frequency power supply portion 19.

The discharge ON wave-form counter 36 counts a detection signal of the N1-type wave-form WN1 shown in FIG. 4(*a*) in the first wave-form monitoring time zone [A] which has been set including the impression start timing of the high frequency voltage and holds the counted value. The discharge OFF wave-form counter 37 counts a detection signal of the N1-type wave-form WN1 shown in FIG. 4(*a*) in the last wave-form monitoring time zone [C] which has been set including the impression end timing of the high frequency voltage and holds the counted value. The abnormal discharge wave-form counter 38 counts a detection signal of the N2-type wave-form WN2 shown in FIG. 4(*a*) in the intermediate wave-form monitoring time zone [B] which has been set including the time zone (the second predetermined time Tb) interposed between the first wave-form monitoring time zone [A] and the last wave-form monitoring time zone [C] and holds the counted value. The leak discharge wave-form counter 39 is a count portion which counts the number of times of the detection of the electric potential change wave-form executed by the V-shaped wave-form detecting portion 35, which is the second wave-form detecting portion, and holds the counted value. The leak discharge wave-form counter 39 is the second counter for storing the number of times at which the V-shaped wave-form detecting portion 35 detects the V-shaped wave-form WV.

The control portion 25 includes a counter control portion 41, a wave-form data storing portion 42, a discharge state judging portion 43 and a maintenance judging portion 44. The counter control portion 41 controls a plurality of counters (the discharge ON wave-form counter 36, the discharge OFF wave-form counter 37, the abnormal discharge wave-form counter 38) so that the detection signal can be counted only at the timing corresponding to a previously set wave-form monitoring time zone. The counter control portion 41 is connected to the discharge ON wave-form counter 36, the abnormal discharge wave-form counter 38 and the discharge OFF wave-form counter 37 by three counter control channels A, B and C through the connection port 40.

As shown in FIG. 4(b), when the counter control portion 41 controls these counters, each counter counts a detection signal outputted from the N-shaped wave-form detecting portion 34 and the V-shaped wave-form detecting portion 35 only at the detection timing of the wave-form detection time zone allotted to the counter concerned. Due to the foregoing, in the large number of wave-form data detected by the N-shaped wave-form detecting portion 34 and the V-shaped wave-form detecting portion 35, only the wave-form appearing at the timing effective for judgment can be counted. In this connection, the counter control channels A, B and C respectively correspond to the first wave-form monitoring time zone [A], the intermediate wave-form monitoring time zone [B] and the last wave-form monitoring time zone [C].

The wave-form data storing portion 42 stores data for judging whether or not the wave-form data, that is, the wave-form showing a change in the electric potential of the probe electrode 22b agrees with a predetermined condition to be detected by the N-shaped wave-form detecting portion 34 and the V-shaped wave-form detecting portion 35. As the wave-form data, an item, which characterizes the wave-form pattern and can be quantified, is selected such as a threshold value (Concerning this matter, refer to the threshold value $\Delta$vth shown in FIG. 4(a).) which is set for judging a width of deflection of the electric potential in the wave-form showing a change in the electric potential or a period of time necessary for one deflection to be finished.

The discharge state judging portion 43 judges a state of the plasma discharge in the processing chamber 3a according to the counted values held by a plurality of counters, that is, by the discharge ON counter 36, the discharge OFF counter 37 and the abnormal discharge wave-form counter 38. When the discharge state judging portion 43 checks the counter values and compares each counted value with a previously set allowable value, it judges a state of the plasma discharge. The maintenance judging portion 44 judges whether or not the maintenance is necessary by the counted value held by the leak discharge wave-form counter 39, that is, when the counter value is checked and compared with a previously set allowable value. Accordingly, the discharge state judging portion 43 and the maintenance judging portion 44 compose a judging portion for judging a state of operation of the plasma processing device, that is, for judging a state of the plasma discharge and further for judging whether or not the maintenance is necessary in the vacuum chamber 3 according to the counted values held by the discharge ON wave-form counter 36, the discharge OFF wave-form counter 37, the abnormal discharge wave-form counter 38 and the leak discharge wave-form counter 39.

In the above constitution, the discharge detecting sensor 23, the plasma monitoring device 20 and the control portion 25 compose a plasma discharge state monitoring unit (the plasma discharge state monitoring device) for monitoring a plasma discharge state in the processing chamber 3a. The plasma monitoring device 20 receives a change in the electric potential induced according to the change in the plasma discharge in the probe electrode 22b and detects an electric potential change wave-form of a specific pattern in the first wave-form monitoring time zone [A] which is set including the impression start timing of the high frequency voltage, the last wave-form monitoring time zone [C] which is set including the impression end timing of the high frequency voltage and the intermediate wave-form monitoring time zone [B] which is set including a time zone interposed between the first wave-form monitoring time zone [A] and the last wave-form monitoring time zone [C]. Further, the plasma monitoring device 20 counts the number of times of the detection of the electric potential change wave-form for each wave-form monitoring time zone and holds the counted value. In this way, the plasma monitoring device 20 composes a data processing portion for executing the processing described above. The control portion 25 is a judgment portion for judging whether or not the plasma discharge exists and whether the plasma discharge state is normal or abnormal.

The plasma processing device is composed as described above. Next, referring to the flow chart shown in FIG. 5, the discharge state judgment processing carried out at the time of operating this plasma processing device will be explained below. In this connection, K1, K2 and K3 shown in the flow chart of FIG. 5 mean counted values respectively held by the discharge ON wave-form counter 36, the abnormal discharge wave-form counter 38 and the discharge OFF wave-form counter 37.

When the judgment processing is started, first, the counted value K1 of the discharge ON wave-form counter 36 is checked (ST1) and it is judged whether or not the counted value K1 is lower than the previously decided allowable value 1 (ST2). In the case where the counted value K1 is higher than the previously decided allowable value 1, it is judged that abnormal discharge, which is not originally to be detected, is generated. Therefore, the abnormal discharge state is informed by the display portion 27 and operation of the device is stopped (ST14). In the case where the counted value K1 is lower than the predetermined allowable value 1 in (ST2), the program proceeds to the next step and the lapse of the first predetermined time Ta of the first wave-form monitoring time zone [A] is judged (ST3). When the time has not passed yet, the program returns to (ST1) and the processing is repeated in the order of (ST1) and (ST2).

When it is checked in (ST3) that the first predetermined time Ta has passed, it is judged whether or not the counted value K1 is 0 (zero) (ST4). In the case where the counted value K1 is 0 (zero), it is judged that a positive proof of the generation of the normal plasma discharge in the processing chamber 3a is not obtained and it is informed by the display portion 27 that no plasma discharge is generated and operation of the device is stopped (ST13). Next, in the case where it is checked in (ST4) that the counted value K1 is not 0 (zero), it is judged that the plasma discharge is generated in the processing chamber 3a and the program proceeds to the next step. That is, the counted value K2 of the abnormal discharge wave-form counter 38 is checked (ST5) and it is judged whether or not the counted value K2 is lower than the predetermined allowable value 2 (ST6). In the case where the counted value K2 is higher than the predetermined allowable value 2, it is judged that abnormal discharge has occurred in the processing chamber 3a exceeding the allowable frequency and the abnormal discharge state is informed by the display portion 27 and operation of the device is stopped (ST14).

In the case where the counted value K2 is lower than the predetermined allowable value 2, the program proceeds to the next step and the lapse of the second predetermined time Tb of the intermediate wave-form monitoring time zone [B] is judged (ST7). When the second predetermined time Tb has not passed yet, the program returns to (ST5) and the processing of (ST5) and (ST6) is repeated in order. In the case where it is checked in (ST6) that the second predetermined time Tb has passed, the program proceeds to the next step. That is, the counted value K3 of the discharge OFF wave-form counter 37 is checked (ST8) and it is judged whether or not the counted value K3 is lower than the predetermined allowable value 3 (ST9).

In the case where the counted value K3 is higher than the previously decided allowable value 3, it is judged that abnormal discharge, which is not originally to be detected, is generated. Therefore, the abnormal discharge state is informed by the display portion 27 and operation of the device is stopped (ST14). In the case where the counted value K3 is lower than the predetermined allowable value 3 in (ST9), the program proceeds to the next step and the lapse of the third predetermined time tc of the last wave-form monitoring time zone [C] is judged (ST10). When the time has not passed yet, the program returns to (ST8) and the processing of (ST8) and (ST9) is repeated in order.

When it is checked in (ST10) that the third predetermined time Tc has passed, it is judged whether or not the counted value K3 is 0 (zero) (ST11). In the case where the counted value K1 is 0 (zero), it is judged that a positive proof of the generation of the plasma discharge in the processing chamber 3a is not obtained and it is informed by the display portion 27 that no plasma discharge is generated and operation of the device is stopped (ST13). Next, in the case where it is checked in (ST11) that the counted value K3 is not 0 (zero), the plasma discharge is normally executed (ST12). Therefore, the discharge state judgment processing is finished.

The above discharge state judgment processing flow composes a method of monitoring a plasma discharge state in a plasma processing device for monitoring a plasma discharge state in the processing chamber 3a in the plasma processing device for executing plasma processing for the board 9 which is an object to be processed and accommodated in the processing chamber 3a. The method of monitoring a plasma discharge state in a plasma processing device includes: a step of receiving an electric potential change, which is induced according to a change of the plasma discharge in the processing chamber 3a in the probe electrode 22b, by the plasma monitoring device 20 which is a data processing portion; a step of detecting an electric potential change wave-form of a specific pattern by the N-type wave-form detecting portion 34 in the first wave-form monitoring time zone [A], the last wave-form monitoring time zone [C] and the intermediate wave-form monitoring time zone [B]; a step in which the number of times of the detection of the electric potential change wave-form is counted by the discharge ON wave-form counter 36, the abnormal discharge wave-form counter 38 and the discharge OFF wave-form counter 37 for each wave-form monitoring time zone [A], [B], [C] and the counted values K1, K2, K3 are held; and a step in which the plasma discharge state judgment, which includes the judgment of existence of the plasma discharge and also includes the judgment of whether the plasma discharge state is normal or abnormal, is executed according to the counted value K1, K2, K3 for each wave-form monitoring time zone [A], [B], [C].

Next, referring to FIG. 6, the maintenance judgment processing carried out after the above discharge state judging processing will be explained below. In this connection, K4 shown in the flow chart of FIG. 6 means a counted value held by the leak discharge wave-form counter 39. An object of providing this maintenance judgment processing is to prevent a problem caused when foreign objects, which are generated by the plasma processing in the vacuum chamber 3 in the process of continuing the operation of the plasma processing device, are attached and deposited. In order to accomplish the object, this maintenance judgment processing is executed by the maintenance judgment portion 44. This maintenance judgment processing is additionally executed after the completion of (ST10) shown in the flow chart of FIG. 5.

Processing (ST20) shown in FIG. 6 is the same processing as that of (ST10) described in the explanation of FIG. 5. When the lapse of the third predetermined time tc of the final wave-form monitoring time zone [C] is checked in (ST20), the counted value K4 of the leak discharge wave-form counter 39 is checked (ST21) and it is judged whether or not the counted value K4 is lower than the predetermined allowable value 4 (ST22). In the case where the counted value K4 is lower than the predetermined allowable value 4, it is judged that the frequency of generation of the leak discharge, which is caused when foreign objects are attached in the processing chamber 3a, is not more than the allowable limit and it is unnecessary to execute the maintenance to remove the foreign objects. In this way, the judgment processing is finished. On the other hand, in the case where the counted value K4 is higher than the predetermined allowable value 4 in (ST22), it is judged that the frequency of generation of the leak discharge exceeds the allowable limit and there is a high possibility that foreign objects are attached and deposited. Therefore, the necessity of the maintenance is informed by the display portion 27 (ST23).

As explained above, the plasma processing device of Embodiment 1 includes a V-shaped wave-form detecting portion 35 which is the second wave-form detecting portion in which a change in the electric potential, which is induced according to the change in the plasma discharge in the probe electrode, is received and an electric potential change wave-form of the specific pattern caused by the leak discharge is detected. Whether or not the maintenance is needed is judged according to the counted value obtained when the leak discharge wave-form counter 39 counts the number of times of detection of the electric potential wave-form by the V-shaped wave-form detecting portion 35. That is, the leak discharge, which is closely correlated with the deposition of foreign objects, is highly sensitively detected and the degree of the deposition of foreign objects is estimated by the accumulated frequency of the leak discharge. Due to this constitution, as compared with the prior art in which the maintenance time is estimated by measuring a period of time in which a predetermined degree of vacuum is obtained at the time of operating the device, whether or not the maintenance time, which is necessary so that the device can be maintained in the best operating condition, has come can be accurately judged.

Embodiment 2

Figure 7:
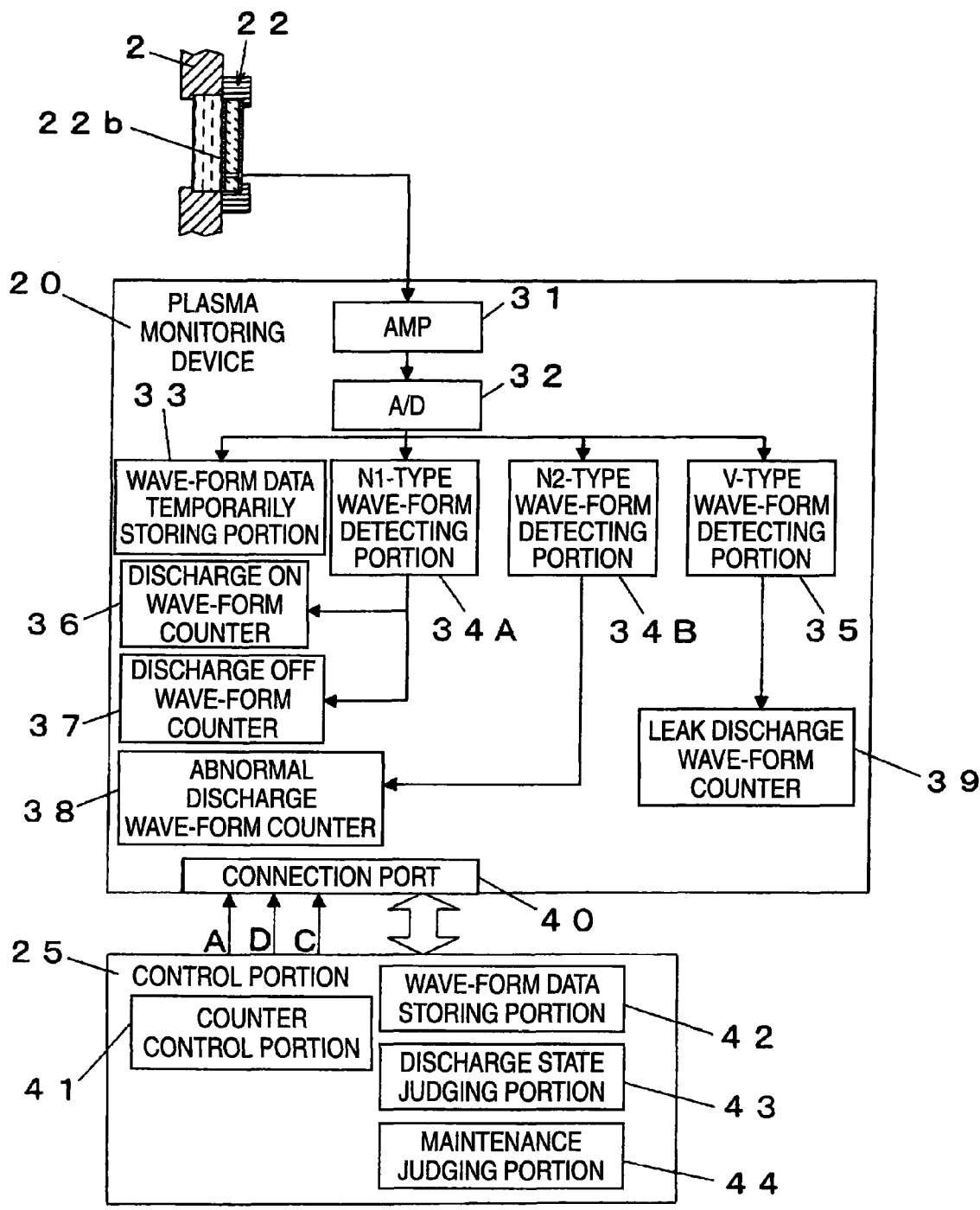
FIG. 7 is a block diagram showing a constitution of the plasma discharge state monitoring device in the plasma processing device of Embodiment 2 of the present invention.
Figure 8:
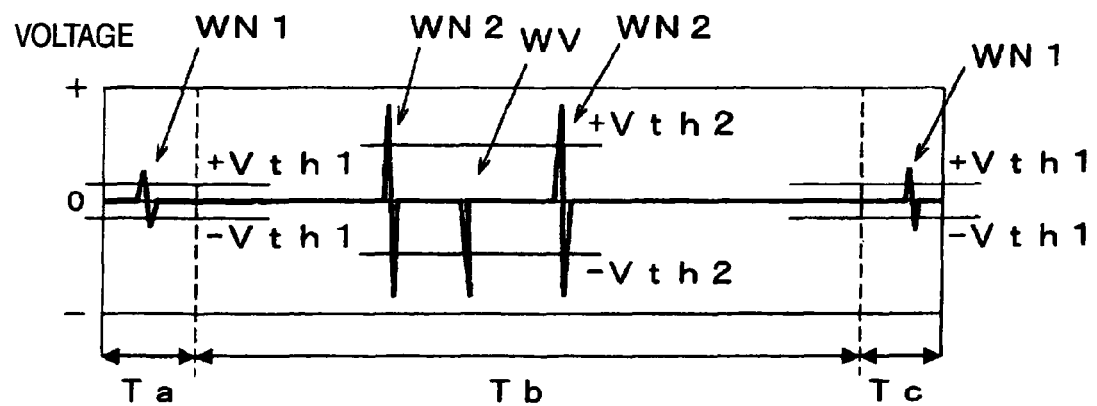
FIGS. 8(a) and 8(b) are schematic illustrations for explaining an electric potential change wave-form and a wave-form monitoring time zone in the plasma discharge state monitoring method of Embodiment 2 of the present invention.
Figure 8:
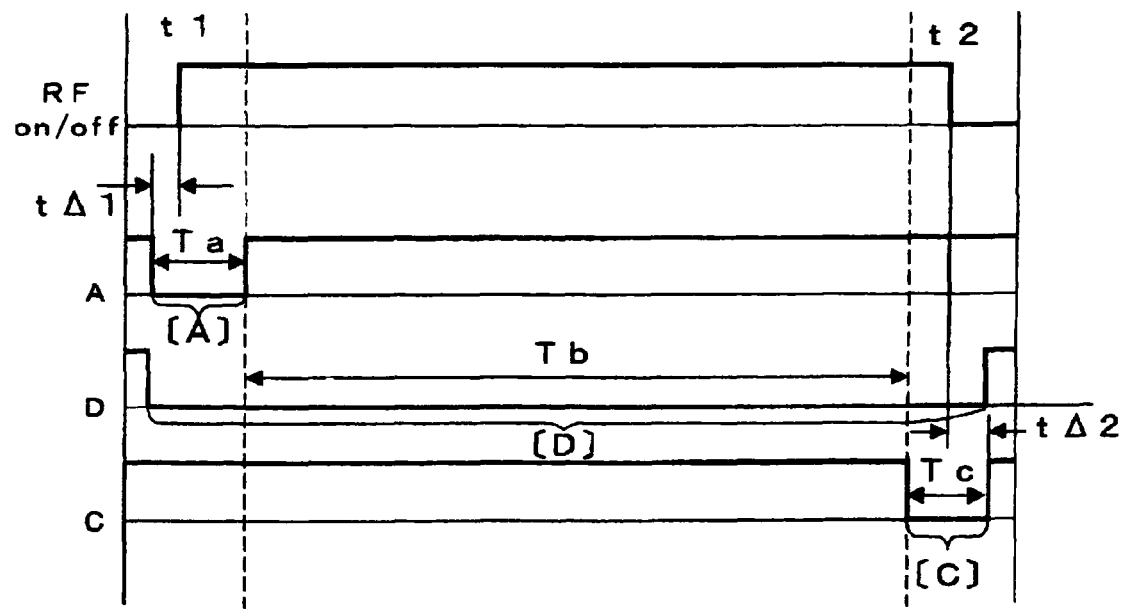
Figure 9:
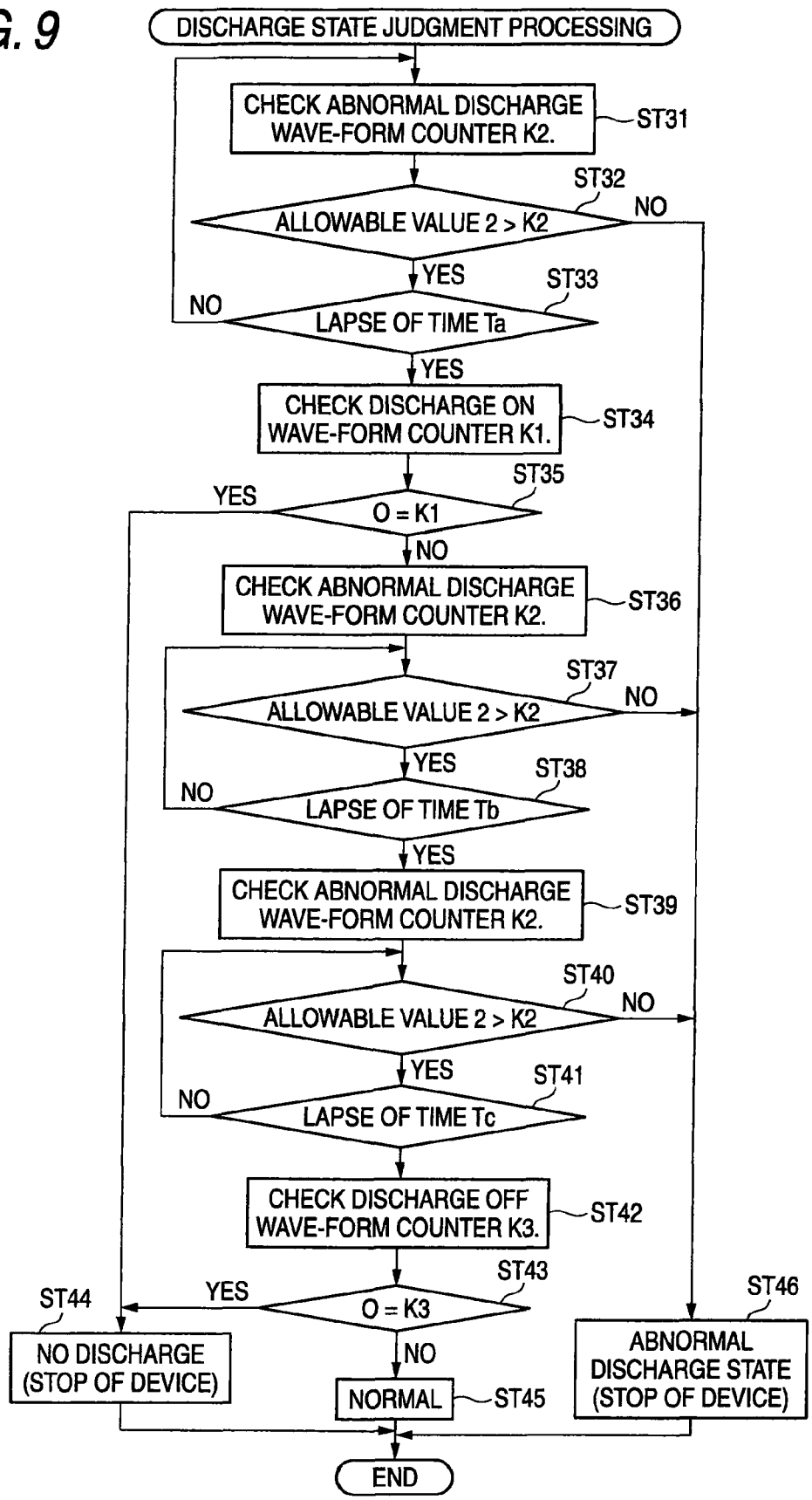
FIG. 9 is a flow chart showing an electric discharge state judgment processing in the plasma discharge state monitoring method of Embodiment 2 of the present invention.

FIG. 7 is a block diagram showing a constitution of the plasma discharge state monitoring device in the plasma processing device of Embodiment 2 of the present invention. FIGS. 8(a) and 8(b) are schematic illustrations for explaining an electric potential change wave-form and a wave-form monitoring time zone in the plasma discharge state monitoring method of Embodiment 2 of the present invention. FIG. 9 is a flow chart showing an electric discharge state judgment processing in the plasma discharge state monitoring method of Embodiment 2 of the present invention.

In the present Embodiment 2, a function of the N-type wave-form detecting portion 34 in Embodiment 1 is divided into two N-type wave-form detecting portions according to a wave-form pattern of an object to be detected, wherein one is an N1-type wave-form detecting portion 34A and the other is an N2-type wave-form detecting portion 34B. The N1-type wave-form detecting portion 34A chiefly detects a wave-form pattern of the electric potential change caused by a usual change in the state at the start of impression of the high frequency power source and the end of impression. The N2-type wave-form detecting portion 34B chiefly detects a wave-form pattern of the electric potential change caused by the abnormal discharge.

In the plasma monitoring device 20 shown in FIG. 7, a detection signal sent from the N1-type wave-form detecting portion 34A is counted by the discharge ON wave-form counter 36 and the discharge OFF wave-form counter 37 and a detection signal sent from the N2-type wave-form detecting portion 34B is counted by the abnormal discharge wave-form counter 38. Except for the above points and also except for the point that the setting of the wave-form monitoring time zone is different at the time of controlling the abnormal discharge wave-form counter 38 by the counter control portion 41, that is, except for the point that the intermediate wave-form monitoring time zone [D] described later is set instead of the intermediate wave-form monitoring time zone [B], the plasma monitoring device 20 shown in FIG. 7 is the same as the plasma monitoring device 20 shown in FIG. 5.

Referring to FIGS. 8(a) and 8(b), functions of the N1-type wave-form detecting portion 34A and the N2-type wave-form detecting portion 34B will be explained below. FIG. 8(a) is a view showing a wave-form pattern detected in the process from the start of operation of the plasma processing device to the end of operation and also showing a predetermined time which has been set in order to detect the wave-form pattern. FIG. 8(b) is a time chart in which the setting timing of a plurality of wave-form monitoring time zones to which the predetermined time is allotted is shown being related to the timing of the start and the end of impression of the high frequency electric power supply by the high frequency electric power supply portion 19.

In the same manner as that of FIG. 4(a), FIG. 8(a) shows a wave-form pattern detected in the process from the start to the end of operation of the plasma processing device. In this case, the first predetermined time Ta, the third predetermined time Tc, the first wave-form monitoring time zone [A] and the last wave-form monitoring time zone [C] are the same as those shown in FIGS. 4(a) and 4(b). Therefore, the explanations are omitted here.

In the first wave-form monitoring time zone [A] and the last wave-form monitoring time zone [C], in the same manner as that of FIG. 4(a), the N-shaped wave-form pattern (the N1-type wave-form WN1) of the electric potential change wave-form, which is caused by a normal state change at the start and the end of impression of the high frequency power supply, is detected. A threshold value level, which is set for detecting the wave-form pattern, is set at a level corresponding to a deflection width of the N1-type wave-form WN1, that is, a threshold value level, which is set for detecting the wave-form pattern, is set at the first threshold value level ±Vth1 which is equal to the threshold value level Vth in FIG. 4(a). The wave-forms caused by the start and the end of impression of the high frequency power supply detected by the N1-type wave-form detecting portion 34A in the first wave-form monitoring time zone [A] and the last wave-form monitoring time zone [C] are respectively counted by the discharge ON wave-form counter 36 and the discharge OFF wave-form counter 37.

The intermediate wave-form monitoring time zone [D] is different from the intermediate wave-form monitoring time zone [B] in Embodiment 1 and includes all of the first predetermined time Ta, the second predetermined time Tb and the third predetermined time Tc. In this case, the intermediate wave-form monitoring time zone [D] includes a time zone (the second predetermined time Tb) interposed between the first wave-form monitoring time zone [A] and the last wave-form monitoring time zone [C]. Further, the intermediate wave-form monitoring time zone [D] includes the first predetermined time Ta and the third predetermined time Tc. When the intermediate wave-form monitoring time zone [D], the object of which is to monitor a wave-form caused by abnormal discharge, is set as described above, it is possible to monitor the generation of abnormal discharge in all the operation time from the start to the end of the plasma processing device. Accordingly, it is possible to more enhance the accuracy of monitoring the generation of abnormal discharge.

In the intermediate wave-form monitoring time zone [D], in the same manner as that shown in FIG. 4(a), the N2-type wave-form WN2 caused by the abnormal discharge in the processing chamber 3a is detected by the N2-type wave-form detecting portion 34B and the V-type weave form WV caused by the leak discharge is detected by the V-type wave-form detecting portion 35. The threshold value level, which is set for detecting a wave-form pattern, is set at a level corresponding to the width of deflection of the N2-type wave-form WN 2, that is, the threshold value level is set at the second threshold value level ±Vth2 higher than the threshold value level Vth in FIG. 4(a). The N2-type wave-form WN2 caused by the abnormal discharge detected in the intermediate wave-form monitoring time zone [D] and the V-type wave-form WV caused by the leak discharge are respectively counted by the abnormal discharge wave-form counter 38 and the leak discharge wave-form counter 39.

In Embodiment 2 described above, the wave-form detecting portion for detecting the N-type wave-form includes a plurality of wave-form detecting portions (the N1-type wave-form detecting portion 34A, the N2-type wave-form detecting portion 34B) for detecting wave-forms, the widths of deflection of the electric potential changes of which are different. Due to this constitution, when a plurality of types of wave-form patterns, which are the same N-type electric potential change wave-form patterns, the deflection widths of the changes in the electric potential of which are different from each other, are detected by a plurality of wave-form detecting portions by using different threshold value levels, a plurality of types of wave-form patterns, which are wave-form patterns similar to each other, the causes of appearance of which are different from each other, can be detected while the wave-form patterns are being rightly discriminated. Accordingly, the discharge state can be more finely monitored.

FIG. 9 shows a discharge state judging processing executed at the time of operation of the plasma processing device in Embodiment 2. In this connection, in the same manner as that of FIG. 5, K1, K2 and K3 shown in the flow chart of FIG. 9 mean counted values respectively held by the discharge ON wave-form counter 36, the abnormal discharge wave-form counter 38 and the discharge OFF wave-form counter 37.

When the judgment processing is started, the counted value K2 of the abnormal discharge wave-form counter 38, the counting object of which is the intermediate wave-form monitoring time zone [D] including all ranges of the operation time of the plasma processing device, is checked (ST31) and it is judged whether or not the counted value K2 is lower than the predetermined allowable value 2 (ST32).

In the case where the counted value K2 is higher than the predetermined allowable value 2, it is judged that abnormal discharge, which is not originally to be detected, is generated. Therefore, the abnormal discharge state is informed by the display portion 27 and operation of the device is stopped (ST46). In the case where the counted value K2 is lower than the predetermined allowable value 2 in (ST32), the program proceeds to the next step and the lapse of the first predetermined time Ta of the first wave-form monitoring time zone [A] is judged (ST33). When the time has not passed yet, the program returns to (ST31) and the processing is repeated in the order of (ST31) and (ST32).

When it is checked in (ST33) that the first predetermined time Ta has passed, the counted value K1 of the discharge OFF wave-form counter 37 is checked (ST34) and it is judged whether or not the counted value K1 is 0 (zero) (ST35). In the case where the counted value K1 is 0 (zero), it is judged that a positive proof of the generation of the plasma discharge in the processing chamber 3a is not obtained and it is informed by the display portion 27 that no plasma discharge is generated. Then, operation of the device is stopped (ST44).

Next, in the case where it is checked in (ST35) that the counted value K1 is not 0 (zero), it is judged that the plasma discharge is generated in the processing chamber 3a and the program proceeds to the next step. That is, the counted value K2 of the abnormal discharge wave-form counter 38 is checked (ST36) and it is judged whether or not the counted value K2 is lower than the predetermined allowable value 2 (ST37). In the case where the counted value K2 is higher than the predetermined allowable value 2, it is judged that abnormal discharge, which is not originally to be generated, has occurred in the processing chamber 3a and the abnormal discharge state is informed by the display portion 27 and operation of the device is stopped (ST46).

In the case where the counted value K2 is lower than the predetermined allowable value 2, the program proceeds to the next step. That is, the lapse of the second predetermined time Tb is judged (ST38). When the second predetermined time Tb has not passed yet, the program returns to (ST37) and the processing of (ST37) and (ST38) is repeated in order. In the case where it is checked in (ST38) that the second predetermined time Tb has passed, the program proceeds to the next step. That is, the counted value K2 of the abnormal discharge wave-form counter 38 is checked again (ST39) and it is judged whether or not the counted value K2 is lower than the predetermined allowable value 2 (ST40).

In the case where the counted value K2 is higher than the predetermined allowable value 2, it is judged that abnormal discharge, which is not originally to be detected, is generated exceeding the allowable frequency. Therefore, the abnormal discharge state is informed by the display portion 27 and operation of the device is stopped (ST46). In the case where the counted value K2 is lower than the predetermined allowable value 2 in ST40, the program proceeds to the next step and the lapse of the third predetermined time tc of the last wave-form monitoring time zone [C] is judged (ST41). When the time has not passed yet, the program returns to (ST40) and the processing of (ST40) and (ST41) is repeated in order.

When it is checked in (ST41) that the third predetermined time Tc has passed, the counted value K3 of the discharge OFF wave-form counter 37 is checked (ST42) and it is judged whether or not the counted value K3 is 0 (zero) (ST43). In the case where the counted value K3 is 0 (zero), it is judged that a positive proof of the generation of the plasma discharge in the processing chamber 3a is not obtained and it is informed by the display portion 27 that no plasma discharge is generated and operation of the device is stopped (ST44). Next, in the case where it is checked in (ST43) that the counted value K3 is not 0 (zero), the plasma discharge is normally executed. Therefore, the discharge state judgment processing is finished.

The above discharge state judgment processing flow composes a method of monitoring a plasma discharge state in a plasma processing device for monitoring a plasma discharge state in the processing chamber 3a in the plasma processing device for executing plasma processing for the board 9 which is an object to be processed and accommodated in the processing chamber 3a. The method of monitoring a plasma discharge state in a plasma processing device includes: a step of receiving an electric potential change, which is induced according to a change of the plasma discharge in the processing chamber 3a in the probe electrode 22b, by the plasma monitoring device 20 which is a data processing portion; a step of detecting an electric potential change wave-form of a specific pattern by the N-type wave-form detecting portion 34 in the first wave-form monitoring time zone [A], the last wave-form monitoring time zone [C] and the intermediate wave-form monitoring time zone [D]; a step in which the number of times of the detection of the electric potential change wave-form is counted by the discharge ON wave-form counter 36, the abnormal discharge wave-form counter 38 and the discharge OFF wave-form counter 37 for each wave-form monitoring time zone [A], [D], [C] and the counted values K1, K2, K3 are held; and a step in which the plasma discharge state judgment, which includes the judgment of existence of the plasma discharge and also includes the judgment of whether the plasma discharge state is normal or abnormal, is executed according to the counted value K1, K2, K3 for each wave-form monitoring time zone [A], [D], [C].

As explained above, the plasma processing device shown in Embodiment 1 or 2 includes: a discharge detection sensor 23, which is a plasma discharge state monitoring unit for monitoring and judging a plasma discharge state in the processing chamber 3a, having a plate-shaped dielectric member 21 attached to the vacuum chamber 3 so that one face can be opposed to the plasma discharge generated in the processing chamber and also having a probe electrode 22b arranged on the other face of the dielectric member 21; and a plasma monitoring device 20, which is a data processing portion, which receives a change in the electric potential induced according to a change in the plasma discharge in the probe electrode 22b, detects an electric potential change wave-form of a specific pattern in a plurality of wave-form monitoring time zones and counts the number of times of appearance of the electric potential change wave-forms for each type of wave-form.

Due to the above constitution, it is possible to make a discharge state judgment, which includes the judgment of whether the discharge exists or does not exist and whether the discharge state is normal or abnormal, according to the counted value of each type of wave-form. In this discharge state judgment, a change in the plasma discharge in the processing chamber 3a can be highly sensitively detected by the discharge detection sensor 23. Therefore, compared with the conventional method in which an influence given to the voltage and current of the high frequency power supply portion by a change in the plasma discharge is detected and also compared with the conventional method in which a discharge state is estimated when a self-bias voltage generated between the electrodes by the plasma discharge is detected, it is possible to more accurately monitor the plasma discharge state. Accordingly, even when it is necessary to generate the plasma discharge in a low output condition, a change in the plasma discharge state can be highly accurately detected and it is possible to rightly monitor whether the plasma discharge exists or does not exist and whether the plasma discharge is normal or abnormal.

INDUSTRIAL APPLICABILITY

The plasma processing device of the present invention can provide advantages in which it is possible to highly accurately monitor an operation state including whether or not the plasma discharge is executed, whether the plasma discharge is normal or abnormal and whether or not the maintenance work in the vacuum chamber is necessary. Therefore, the present invention can be effectively applied to a technical field in which plasma cleaning is executed for an object to be processed such as a board.

The invention claimed is:

1. A plasma processing device for executing plasma processing for an object to be processed which is accommodated in a processing chamber, comprising:
   a vacuum chamber forming the processing chamber;
   an electrode portion arranged in the processing chamber;
   a vacuum exhaust portion for exhausting gas from the processing chamber by vacuum;
   a gas supply portion for supplying gas which is used for generating plasma into the processing chamber;
   a high frequency power supply portion for generating plasma discharge in the processing chamber when a high frequency voltage is impressed upon the electrode portion;
   a matching device for matching impedance of a plasma discharge circuit for generating plasma discharge with impedance of the high frequency power supply portion; and
   a plasma discharge state monitoring means for monitoring a plasma discharge state in the processing chamber, the plasma discharge state monitoring means including:
   a discharge detection sensor having a plate-shaped dielectric member attached to the vacuum chamber so that one face of the plate-shaped dielectric member can be opposed to the plasma discharge generated in the processing chamber and also having a probe electrode arranged on the other face of the plate-shaped dielectric member;
   a plurality of wave-form detecting portions which receives a change in electric potential induced according to a change in the plasma discharge in the probe electrode and outputs a detection signal each time a change in electric potential agreeing with a predetermined condition appears, wherein one of the plurality of wave-form detecting portions further includes:
   an N-type wave-form detecting portion for detecting an N-type electric potential change wave-form which is formed into an N-shaped wave-form pattern returning to a steady value after an electric potential has deflected to both the positive and the negative side, and
   a V-type wave-form detecting portion for detecting a V-shaped electric potential change wave-form which is formed into a V-shaped wave-form pattern returning to a steady value after the electric potential has deflected only to the negative side;
   a plurality of counters which respectively correspond to the plurality of wave-form detecting portions and count the detection signals outputted from the respectively corresponding plurality of wave-form detecting portions and hold the counted values;
   a discharge state judging portion for judging a state of plasma discharge according to the counted value of the counter obtained when the detection signal of the N-type wave-shape detecting portion is counted; and
   a maintenance judging portion for judging whether or not the maintenance of the vacuum chamber is necessary according to the counted value of the counter obtained when the detection signal of the V-type wave-form detecting portion is counted,
   wherein the N-type wave-form detecting portion detects the N-type electric potential change wave-form in a first wave-form monitoring time zone including an impression start timing of the high frequency voltage upon the electrode portion, a last wave-form monitoring time zone including an impression end timing of the high frequency voltage upon the electrode portion, and an intermediate wave-form monitoring time zone interposed between the first wave-form monitoring time zone and the last wave-form monitoring time zone, and
   the V-type wave-form detecting portion detects the V-shaped electric potential change wave-form in the intermediate wave-form monitoring time zone.

2. The plasma processing device according to claim 1, wherein the wave-form detecting portions further includes a plurality of wave-form detecting portions for:
   detecting a wave-form, and
   detecting a width of deflection of the electric potential change and using the width of deflection as the predetermined condition for said outputting the detection signal.

3. The plasma processing device according to claim 2, wherein the N-type wave-form detecting portion includes a first predetermined condition that is a first width of deflection,
   wherein the V-type wave-form detecting portion includes a second predetermined condition that is a second width of deflection that is different than the first width of deflection.

4. The plasma processing device according to claim 1, wherein the dielectric member is made of optically transparent glass attached to a peep-hole used for watching the inside of the processing chamber from the outside of the vacuum chamber and the probe electrode is made of optically transparent conductive material.

5. The plasma processing device according to claim 1, wherein the predetermined conditions in the respectively corresponding plurality of wave-form detecting portions are different from each other.

6. The plasma processing device according to claim 1, wherein the plurality of wave-form detecting portions have a threshold value level which has been previously set on both the positive and the negative side, the threshold value level being set for detecting an abnormal discharge, and a leak discharge that is a minute discharge generated between a portion upon which a high frequency voltage generated by a deterioration of an insulating property caused by foreign objects attached and deposited in the processing chamber is impressed and a portion of a ground electric potential, and the N-type wave-form is formed due to the abnormal discharge and the V-type wave form is formed due to the leak discharge.

7. A plasma discharge state monitoring device used for a plasma processing device for executing plasma processing for an object to be processed which is accommodated in a processing chamber so as to monitor a plasma discharge state in the processing chamber, comprising:

a discharge detection sensor at least having a plate-shaped dielectric member attached to a vacuum chamber forming the processing chamber so that one face of the plate-shaped dielectric member can be opposed to the plasma discharge generated in the processing chamber and also having a probe electrode arranged on the other face of the plate-shaped dielectric member; and a wave-form detecting portion for receiving a change in electric potential induced according to a change in the plasma discharge in the probe electrode and for detecting a predetermined wave-form, the wave-form detecting portion including:

an N-type wave-form detecting portion for detecting an N-type electric potential change wave-form which is formed into an N-shaped wave-form pattern returning to a steady value after an electric potential has deflected to both the positive and the negative side;

a V-type wave-form detecting portion for detecting a V-shaped electric potential change wave-form which is formed into a V-shaped wave-form pattern returning to a steady value after the electric potential has deflected only to the negative side;

a plurality of counters which respectively correspond to the plurality of wave-form detecting portions and count the detection signals outputted from the respectively corresponding plurality of wave-form detecting portions and hold the counted values;

a discharge state judging portion for judging a state of plasma discharge according to the counted value of the counter obtained when the detection signal of the N-type wave-shape detecting portion is counted; and a maintenance judging portion for judging whether or not the maintenance of the vacuum chamber is necessary according to the counted value of the counter obtained when the detection signal of the V-type wave-form detecting portion is counted, wherein the N-type wave-form detecting portion detects the N-type electric potential change wave-form in a first wave-form monitoring time zone including an impression start timing of the high frequency voltage upon the electrode portion, a last wave-form monitoring time zone including an impression end timing of the high frequency voltage upon the electrode portion, and an intermediate wave-form monitoring time zone interposed between the first wave-form monitoring time zone and the last wave-form monitoring time zone, and the V-type wave-form detecting portion detects the V-shaped electric potential change wave-form in the intermediate wave-form monitoring time zone.

8. The plasma discharge state monitoring device according to claim 7, wherein the N-type wave-form detecting portion includes:

a first counter for recording the number of times of detecting the N-type wave-form, and a second counter for recording the number of times of detecting the V-type wave-form.

9. The plasma processing device according to claim 7, wherein the N-type wave-form detecting portion checks that the state agrees with a condition that the detected electric potential change has reached the threshold value level has been previously set on both the positive and the negative side, and the V-type wave-form detecting portion checks that the state agrees with a condition that the detected electric potential change has reached the threshold value level has been previously set on both the positive and the negative side, only on the negative side.

* * * * *